United States Patent [19]

Ramet

[11] Patent Number: 4,890,014

[45] Date of Patent: Dec. 26, 1989

[54] SEQUENTIAL OPERATION DIFFERENTIAL CURRENT AMPLIFIER

[75] Inventor: Serge Ramet, Grenoble, France

[73] Assignee: SGA-Thomson Microelectronics S.A., Gentilly, France

[21] Appl. No.: 246,757

[22] Filed: Sep. 20, 1988

[30] Foreign Application Priority Data

Sep. 21, 1987 [JP] Japan .................................. 62-13333

[51] Int. Cl.$^4$ .............................................. H03K 5/24
[52] U.S. Cl. .................... 307/355; 307/494; 328/146
[58] Field of Search .............. 307/350, 355, 362, 356, 307/494; 328/146, 147

[56] References Cited

U.S. PATENT DOCUMENTS

| | | |
|---|---|---|
| 3,237,116 | 2/1966 | Skinner et al. . |
| 3,321,628 | 5/1967 | Webb . |
| 4,553,052 | 11/1985 | Takahashi ............................ 307/494 |
| 4,707,624 | 11/1987 | Yee ...................................... 307/494 |
| 4,748,418 | 5/1988 | Kerth .................................. 307/362 |

FOREIGN PATENT DOCUMENTS 2167404 1/1972 France .

OTHER PUBLICATIONS

K. Hoskins, "Autozero Chip Cuts Op Amp Offset Voltages to a Mere ±5 uV", Electronic Design, vol. 33, No. 7 (Mar. 21, 1985).

*Primary Examiner*—John Zazworsky
*Attorney, Agent, or Firm*—Lowe, Price, LeBlanc, Becker & Shur

[57] ABSTRACT

A device for comparing currents comprises a first resistor (R1) connected between a high voltage source (VCC) and a connection node (N), first and second current source (I1, I2) connected between a low voltage source (VEE) and the connection node by first and second switches (S1, S2) closed during the first and second phases, a first differential amplifier (A1), a first input (−) of which is connected with the connection node by a first capacitor (C1), a second input (+) of which is connected with an intermediate voltage source, and the output of which is connected with the input (−) by a third switch (S3) closed during the first phase, a second resistor (R2) having a high value with respect to the first resistor connected between the connection node and the intermediate voltage source, and servo-control means operating during a phase preliminary to the first and second phases for urging the voltage on the connection node to be equal to the intermediate voltage, when the first switch is closed.

3 Claims, 2 Drawing Sheets

4,890,014

SEQUENTIAL OPERATION DIFFERENTIAL CURRENT AMPLIFIER

BACKGROUND OF THE INVENTION

The instant invention relates to a differential current amplifier permitting to compare two currents with a very high accuracy and to supply an output voltage which is proportional to the difference between those currents.

It is well known that, when one tries to compare currents with a high accuracy by means of integrated circuits, one is limited by the offset voltage of the differential amplifiers. This offset voltage is the difference between the input voltages for a null voltage at the output.

In order to compensate for this offset voltage, amplifiers called auto-zero, operating according to a sequential mode, are conventionally used.

Such an amplifier-comparator operating in a sequential mode will be disclosed in relation with FIG. 1. This figure shows the two current sources to be compared I1, I2 connected between a low reference voltage VEE and respective switches S1 and S2 respectively closed during non-overlapping phases $\Phi 1$ and $\Phi 2$. The other terminals of the switches S1 and S2 are connected at a node N. The node N is connected with a high supply source VCC by a resistor R1. The node N is also connected with the first input $(-)$ of a differential amplifier A1 through a capacitor C1. The second input of the differential amplifier A1 is connected with a voltage source of intermediate value, usually the ground when the high voltage VCC is positive and when the low voltage VEE is negative. The input and output of the amplifier A1 are looped through a switch S3, closed during the phase $\Phi 1$ during which the current source I1 is connected through the first switch S1.

This circuit operates as follows.

During a first phase, $\Phi 1$, the switches S1 and S3 are on and the switch S2 is off. The current I1 flows through the resistor R1 and the capacitor C1 is charged at the voltage $VCC - R1 I1 - Vos$, where Vos is the offset voltage of the amplifier A1.

During the phase $\Phi 2$, the switches S1 and S3 are off and the switch S2 is on. The current I2 flows through the resistor R1 and the output voltage of the amplifier A1 is equal to :

$$V = G(A1) R1 [I1 - I2]$$

where G(A1) is the open loop gain of the amplifier A1. Then, owing to the phase $\Phi 1$ called auto-zero phase, the offset voltage of amplifier A1 has been theoritically perfectly compensated for. However, an error inherent to the switching off of the switch S3 at the end of the phase $\Phi 1$ is still existing. Indeed, this switch is usually implemented by means of a MOS transistor and, at the switching off, a portion of the charges stored in the transistor channel is transferred on capacitor C1 and this injection of charges causes an error. If one wishes to be able to detect a minimum current Imin of about 1.5 microamperes, the injected charge has to be lower than $Qmin = CR Imin$. With conventional values, $C = 10$ pF, $R = 300$ $\Omega$ and $Imin = 1.5$ $\mu A$, one obtains :

$$Qmin = 4.5 \ 10^{-15} \text{ coulombs}$$

(this charge corresponds to about 28,000 times the charge of one electron). In practice, it is impossible that the amount of charges injected during the switching off of the switch S3 be lower than this value Qmin even by using circuitries that permit to minimize the injection of the charges.

Therefore, an object of the instant invention is to provide for a differential current amplifier compensating not only for the offset voltage of a differential amplifier, but also permitting to minimize the influence of the charge injection inherent to the switching off of a switch.

SUMMARY OF THE INVENTION

In order to achieve those objects and others, the instant invention provides for a current comparison device provided with a differential current amplifier with offset voltage compensation and with sequential operation comprising a high voltage source, a low voltage source, an intermediate voltage source, a first resistor connected between the high voltage source and a connection node, a first current source connected between the low voltage source and the connection node through a first switch closed during a first phase, a second current source connected between the low voltage source and the node through a second switch closed during a second phase, a first differential amplifier, a first input of which is connected with said node through a first capacitor, the second input of which is connected with the intermediate voltage source, and the output of which is connected with the input through a third switch closed during the first phase, a second resistor having a high value with respect to the first resistor connected between said node and the intermediate voltage source, and servo-control means operating during a phase preliminary to the first and second phases to urge the voltage on said node to be equal to that of the intermediate voltage source, when the first switch is closed.

According to an embodiment of the instant invention, the servo-control means comprise a bipolar transistor connected between the first resistor and the connection node ; a second differential amplifier, a first input of which is connected with the connection point of the transistor and the first resistor, the second input of which is connected with a second capacitor, the other terminal of which is connected with the intermediate voltage source, and the output of which is connected with the base of the transistor ; and switching means for connecting during the preliminary phase the first input of the first amplifier with the intermediate voltage source, the second input of the first amplifier with said node, and the output of the first amplifier with the second input of the second amplifier.

According to an embodiment of the instant invention, the switching means comprise a fourth switch connected between the first capacitor and the connection node, and a fifth switch between the second input of the first differential amplifier and the intermediate voltage source, those fourth and fifth switches being off during the preliminary phase and on during the other phases ; and a sixth switch connected between the second input of the first differential amplifier and the connection node, a seventh switch connected between the first input of the first differential amplifier and the intermediate voltage source and a eight switch connected between the output of the first differential amplifier and the second input of the second differential amplifier, those sixth, seventh and eighth switches being on during the preliminary phase and off during the other phases.

Therefore, the instant invention permits to measure extremely low current differences. For example, one tries to detect current differences lower than 1.5 μA in a range of input currents varying from 800 μA to 12.8 mA (those values correspond to values that are usually used in the analog/digital converters).

BRIEF DESCRIPTION OF THE DRAWINGS

Those objects, features, advantages and others of the instant invention will clearly appear from the following detailed description of preferred embodiments, in connection with the attached drawings, wherein.

DETAILED DESCRIPTION OF THE DRAWINGS

Figure 1:
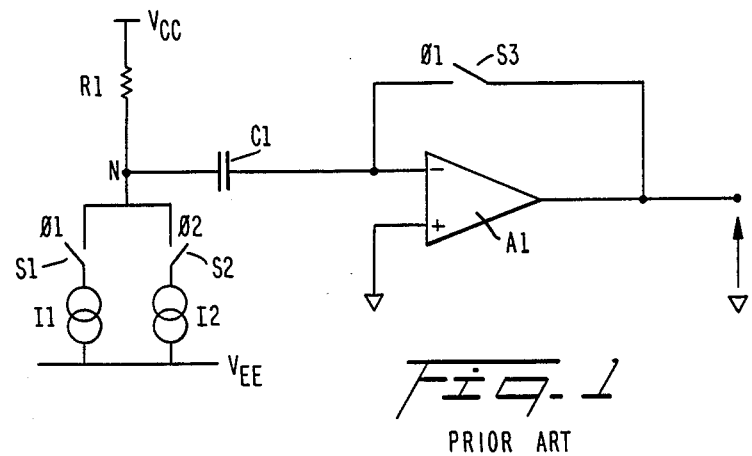
FIG. 1, previously disclosed, was intended to illustrate a circuit according to the prior art.
Figure 2:
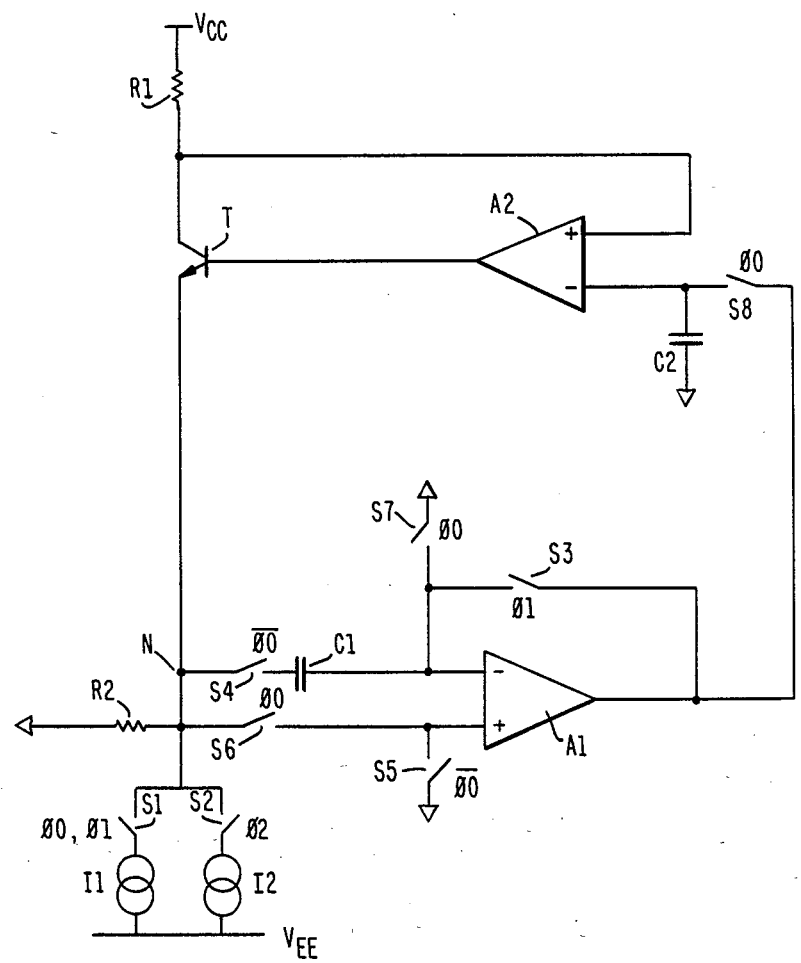
FIG. 2 shows a circuit diagram according to the instant invention.

On FIG. 2, some components already disclosed in relation with FIG. 1 are labelled with the same references. The resistor R1, the node N, the switches S1 and S2 and the current sources I1 and I2, as well as the differential amplifier A1, the capacitor C1 and the switch S3 are shown again.

Moreover, an NPN-type bipolar transistor T is connected between the resistor R1 and the node N. The base of this transistor receives the output of a second differential amplifier A2, the first input (+) of which is connected with the connection point between the collector of transistor T and the resistor R1, and the second input of which is connected with a first terminal of a capacitor C2, the outer terminal of which is connected to the intermediate reference voltage. A resistor R2 is connected between the node N and the intermediate reference voltage.

On the other hand, further to the operating phases Φ1 and Φ2 hereinabove disclosed, an additional operating phase Φ0 is provided for, during which the switch S1 is closed and additional switches S4 to S8 are actuated. Switch S4, connected between the capacitor C1 and the node N, and switch S5, connected with the second input of amplifier A1 and the intermediate voltage (usually the ground), are closed outside phase Φ0, that is, during the phases Φ1 and Φ2. It will be said that those switches are controlled by the signal Φ*0. As for the switches S6 to S8, they are closed during the phase Φ0. The switch S6 is located between the second input of the amplifier A1 and the node N, the switch S7 is connected between the first input of the amplifier A1 and the ground, and the switch S8 is connected between the output of the amplifier A1 and the second input of the amplifier A2.

Therefore, outside phase Φ0, that is, during the phases Φ1 and Φ2, the configuration is substantially the same as during the phases Φ1 and Φ2 disclosed in relation with FIG. 1, except for the presence of resistor R2 and transistor T which is controlled by the amplifier A2, the second input of which is connected with the capacitor C2.

The aim of the preliminary phase Φ0 is to set the voltage at the node N by acting upon the amplifier A2, which acts in turn upon the transistor T.

Therefore, during the preliminary phase, the input (−) of the amplifier A1 is grounded through the switch 7 and its input (+) is connected with the node N through the switch S6 while its output is connected with the input (−) of the amplifier A2 through the switch S8. Therefore, the set of the amplifiers A1, A2 and of the transistor T forms a feedback circuit. This circuit is balanced when the input (+) of the amplifier A1 reaches the same voltage as its input (−) which is grounded. As a result, the voltage on the node N is roughly the ground potential and, therefore, since the other input of the resistor R2 is grounded, a null current tends to flow through this resistor. Thus, the whole current from the current source I1 flows through the resistor R1.

The function of the capacitor C2 is to maintain the state of the amplifier A2 and therefore the base current in the transistor T after opening the switch S8.

Therefore, during the following phase which, as it will be appreciated, is roughly identical to the phase Φ1 of the circuit shown on FIG. 1, the same current will always flow through the resistor R1 and the node N will always roughly remain at the ground potential. During this phase Φ1, as previously, the capacitor C1 is biased for carrying out the offset compensation of the amplifier A1.

During the phase Φ2, which is also roughly identical to the phase Φ2 shown on FIG. 1, one will obtain at the output of the amplifier A1 a voltage V equal to:

$$V = G(A1) \, R2 \, [I1 - I2]$$

The difference with respect to the case disclosed on FIG. 1 lies in the fact that it is the resistor R2 and no longer the resistor R1 which intervenes in the setting of the output voltage. Typically, a resistor R1 with a value of about 30 Ω and a resistor R2 with a value of about 1,000 Ω can be chosen. The opening of the switch S3 at the end of the phase Φ1 will entail the same charge injection onto the capacitor C1 as in the example of Fig. 1 but the influence of this charge injection at the output of the amplifier A1 will be reduced by the ratio of the values of the resistors R1 and R2, that is, by a ratio 30 in the example given hereinabove. Therefore, for obtaining an accuracy of the current difference measurement of about 1.5 mA, instead of having to limit the charge injected during the switching off of a MOS transistor of only about $5 \times 10^{-15}$ coulombs, the device will be able to withstand an injection 30 times more important, that is, about $150 \times 10^{-15}$ coulombs, which is quite realizable in practice.

Therefore, the instant invention permits to increase by a factor 30, or more according to the ratio R2/R1, the minimum accuracy that can be obtained with a current amplifier-comparator.

It will be moreover noted that the accuracy of the servo-control realized by the loop A1, A2, T is not critical since it is a second order phenomenon, the preliminary phase being followed by an auto-zero phase.

Of course, the instant invention is liable of numerous variations which will clearly appear to those skilled in the art. The additional improvements conventionally brought to the circuits of the type shown on FIG. 1 can be brought to the circuits of the type shown on FIG. 2 according to the invention. More particularly, it is possible to use as a switch S3 a switch with low charge injection such as the one shown on FIG. 3.

Figure 3:
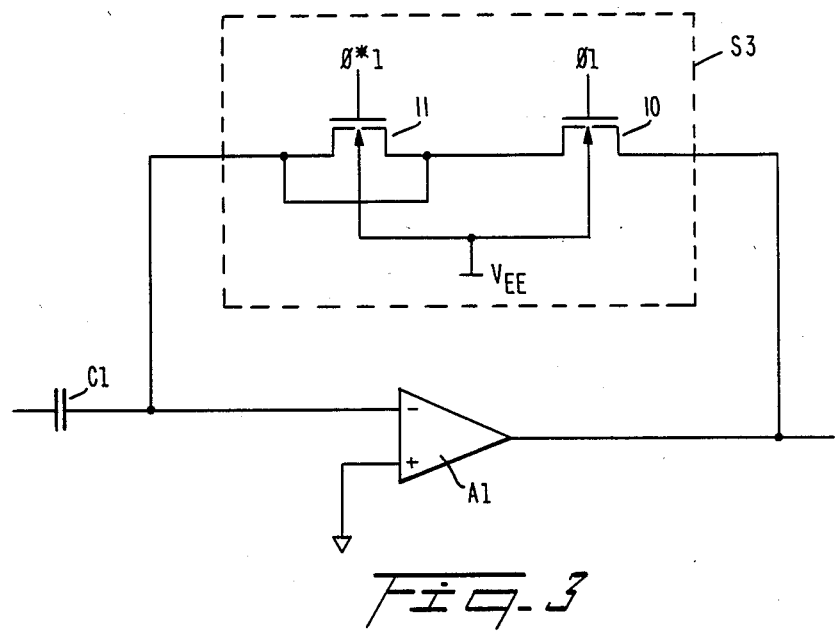
FIG. 3 shows an examplary switch with low charge injection.

In FIG. 3, the switch S3 is implemented by a MOS transistor 10 controlled by the signal Φ1. This transistor 10 is in series with a MOS transistor 11, the drain and the source of which are shorted, called dummy MOS transistor, the gate of which receives the signal Φ*1 complementary to Φ1. The transistor 11 is chosen so that its channel length L2 is equal to the length of the channel L1 of transistor 10 and so that its channel width W2 is twice the width, W1, of transistor 10 (or more usually so that $2W1/L1=W2/L2$). The biasing voltages of the substrates of transistors 10 and 11 are identical, equal to VEE in FIG. 3. Therefore, at the switching off of transistor 10, the charges that would be injected into the capacitor C1 are compensated for at the first order by the transistor 11.

I claim:

1. A comparison device for currents provided with a differential current amplifier with offset compensation and with sequential operation according to a preliminary phase (Φ0) and first and second operating phases (Φ1, Φ2), said comparison device being connectable to a high voltage source (VCC), a low voltage source (VEE) and an intermediate voltage source and comprising:
    a first resistor (R1) connected between the high voltage source and a connection node (N) ;
    a first current source (I1) connected between the low voltage source and said node through a first switch (S1) closed during the first phase (Φ1) ;
    a second current source (I2) connected between the low voltage source and said node through a second switch (S2) closed during the second phase (Φ2) ;
    a first differential amplifier (A1), a first input (−) of which is connected during said operating phases with said node through a first capacitor (C1), the second input (+) of which is connected during said operating phases with the intermediate voltage source, and the output of which is connected with the first input by a third switch (S3) closed during the first phase;
    a second resistor (R2) having a high value with respect to the first resistor connected between said node and the intermediate voltage source ; and
    servo-control means operating during said preliminary phase (Φ0) for urging, when the first switch is closed, the voltage of said node to be equal to the intermediate voltage source and the current in the first resistor (R1) to be roughly equal to the current of the first current source.

2. A device according to claim 1, wherein the servo-control means comprise :
    a bipolar transistor (T) connected between the first resistor and said node ;
    a second differential amplifier, a first input of which is connected with the connection point of said transistor and of the first resistor, the second input of which is connected with a second capacitor, the other terminal of which is connected with the intermediate voltage source, and the output of which is connected with the base of said transistor ; and
    switching means for connecting during the preliminary phase the first input of the first amplifier with the intermediate voltage source, the second input of the first amplifier with said node, and the output of the first amplifier with the second input of the second amplifier.

3. A device according to claim 2, wherein the switching means comprise :
    a fourth switch connected between the first capacitor and said node, and a fifth switch between the second input of the first differential amplifier and the intermediate voltage source, those fourth and fifth switches being open during the preliminary phase and closed during the other phases ; and
    a sixth switch connected between the second input of the first differential amplifier and said node, a seventh switch connected between the first input of the first differential amplifier and the intermediate voltage source and a eighth switch connected between the output of the first differential amplifier and the second input of the second differential amplifier, those sixth, seventh and eighth switches being on during the preliminary phase and off during the other phases.

* * * * *

UNITED STATES PATENT AND TRADEMARK OFFICE
CERTIFICATE OF CORRECTION

PATENT NO. : 4,890,014

DATED : December 26, 1989

INVENTOR(S) : Serge RAMET

It is certified that error appears in the above-identified patent and that said Letters Patent is hereby corrected as shown below:

TITLE PAGE:

Item [30] should read as follows:

--Sep. 21, 1987 [FR]    France ........................... 87-13333--.

Signed and Sealed this

Fourteenth Day of July, 1992

Attest:

DOUGLAS B. COMER

Attesting Officer        Acting Commissioner of Patents and Trademarks